US012707757B2

(12) United States Patent
Fan et al.

(10) Patent No.: US 12,707,757 B2
(45) Date of Patent: Aug. 11, 2026

(54) METHOD FOR MAKING SOLAR CELL AND SOLAR CELL

(71) Applicant: LAPLACE Renewable Energy Technology Co., Ltd., Shenzhen (CN)

(72) Inventors: Wei Fan, Shenzhen (CN); Jiaji Lin, Shenzhen (CN); Wu Zhang, Shenzhen (CN)

(73) Assignee: LAPLACE Renewable Energy Technology Co., Ltd., Shenzhen (CN)

( * ) Notice: Subject to any disclaimer, the term of this patent is extended or adjusted under 35 U.S.C. 154(b) by 171 days.

(21) Appl. No.: 18/629,905

(22) Filed: Apr. 8, 2024

(65) Prior Publication Data

US 2024/0258441 A1 Aug. 1, 2024

(51) Int. Cl.

*H10F 77/30* (2025.01)
*H10F 10/14* (2025.01)
*H10F 71/00* (2025.01)
*H10F 77/20* (2025.01)

(52) U.S. Cl.

CPC ........... *H10F 77/315* (2025.01); *H10F 10/14* (2025.01); *H10F 71/1221* (2025.01); *H10F 77/211* (2025.01); *H10F 77/215* (2025.01); *H10F 77/311* (2025.01)

(58) Field of Classification Search

CPC .... H10F 77/315; H10F 77/311; H10F 77/211; H10F 77/215; H10F 71/121; H10F 71/1221

See application file for complete search history.

(56) References Cited

U.S. PATENT DOCUMENTS

2012/0058632 A1* 3/2012 Abbott .................. H10F 77/211 977/773
2024/0258441 A1 8/2024 Fan et al.
2025/0301818 A1* 9/2025 Chen ..................... H10F 77/211

FOREIGN PATENT DOCUMENTS

CN 104485390 A * 4/2015 ........... H10F 71/121
CN 109065643 A * 12/2018 .......... H10P 14/3411
CN 115312629 A 11/2022
CN 115483310 A 12/2022

* cited by examiner

*Primary Examiner* — Tuan A Hoang
(74) *Attorney, Agent, or Firm* — ScienBiziP, P.C.

(57) ABSTRACT

A method for making a solar cell includes: providing and texturing a silicon substrate including a first surface and a second surface opposite to the first surface; performing boron diffusion and high-temperature oxidation treatment on the silicon substrate; forming a tunnel oxide layer and a doped polycrystalline silicon layer on a second surface; depositing a passivation layer on the first surface or both the first surface and the second surface; depositing anti-reflection layers on the first and second surfaces; forming metal grid lines on both the first and second surfaces to form a solar sheet; applying a deflection voltage to the solar sheet; maintaining the deflection voltage and using laser to scan the metal grid lines on the first surface.

19 Claims, 2 Drawing Sheets

METHOD FOR MAKING SOLAR CELL AND SOLAR CELL

FIELD

The subject matter herein relates to a method for making a solar cell and the solar cell.

BACKGROUND

A tunnel oxide passivating contacts (TOPCon) cell is a type of photovoltaic crystalline silicon cell. The TOPCon cell includes a N-type silicon substrate, a tunnel oxide layer that is a very thin layer of silicon oxide and a phosphorus doped microcrystalline-amorphous mixed silicon film on a back surface of the silicon substrate. Then, crystallinity of the mixed silicon film changes to polycrystalline after annealing. The silicon oxide layer and phosphorus doped polycrystalline silicon film cooperatively form a passive contact structure on the back surface of the silicon substrate. The ultra-thin silicon oxide layer of TOPCon cell utilizes quantum tunneling effect, which allows majority carriers to tunnel and blocks minority carrier to pass. A layer of metal is deposited on the phosphorus doped polycrystalline silicon film as an electrode, and the electrode does not need to contact the silicon substrate by any conductive hole extending through the passive contact structure to complete current transmission, thereby reducing an efficiency loss caused by recombination at the electrode. In addition, the phosphorus doped polycrystalline silicon layer can further reduce the efficiency loss caused by surface recombination, thereby improving cell efficiency. In recent years, TOPCon cells have received widespread attention and research due to advantages such as high conversion efficiency, low attenuation performance, and high cost-effectiveness in mass production. A theoretical maximum conversion efficiency of the TOPCon cell is as high as 28.7%, which is closer to a theoretical maximum conversion efficiency of crystalline silicon solar cells (29.43%), and has great research and development potential.

BRIEF DESCRIPTION OF THE DRAWINGS

Implementations of the present technology will now be described, by way of embodiments only, with reference to the attached figures.

DETAILED DESCRIPTION

Figure 1:
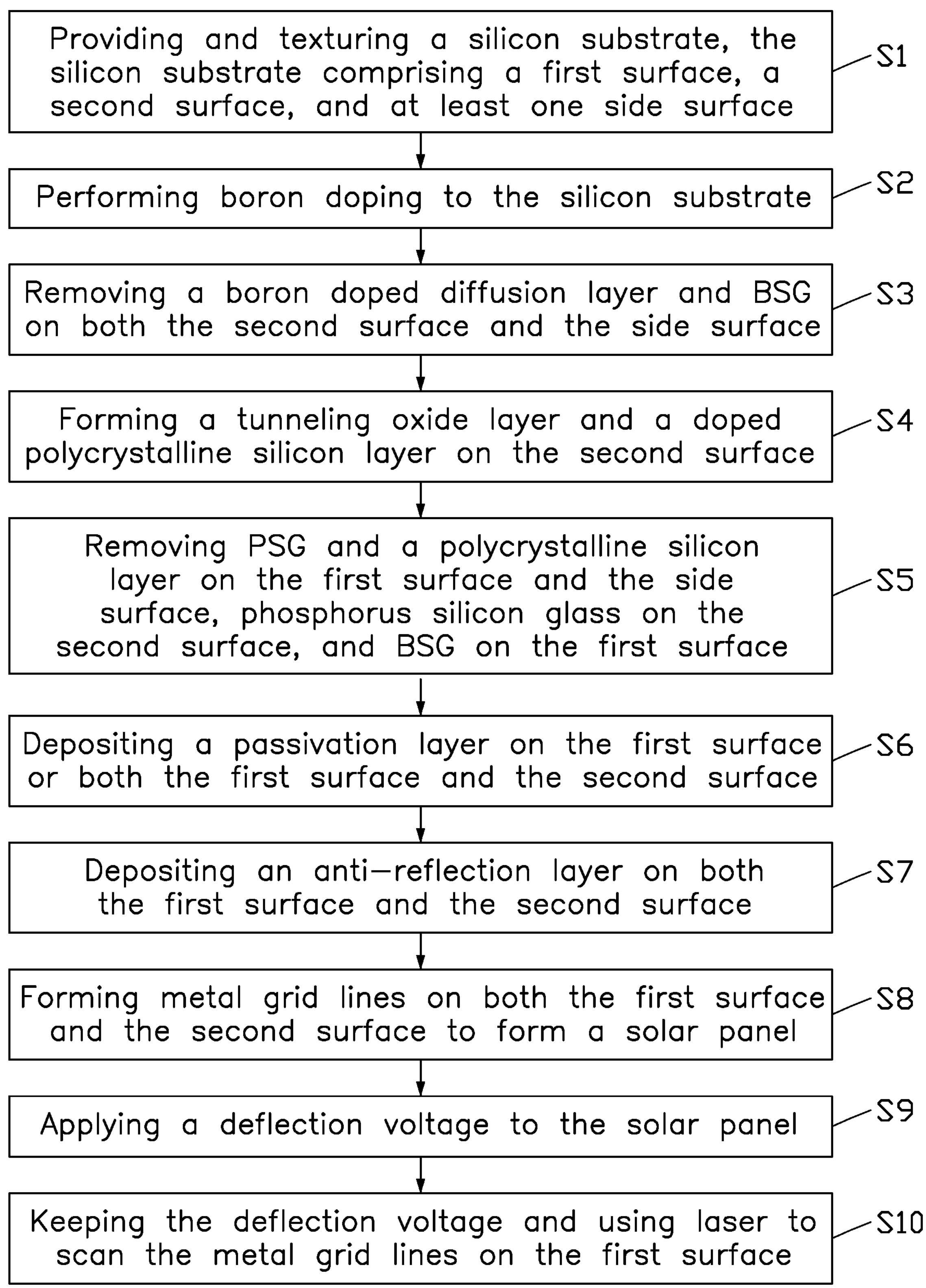
FIG. 1 is a flowchart of a method for making a TOPCon solar cell according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like.

A traditional method for making a TOPCon cell mainly includes steps such as texturing, boron diffusing, laser selective emitter (LSE), high-temperature oxidizing, doping polycrystalline silicon on a back surface, depositing a passivation layer, depositing anti-reflection film, printing metal grid lines, and sintering.

The LSE step is used to improve a conversion efficiency of the crystalline silicon cell. This step optimizes collection of charge carriers and current transporting on a front surface of the cell by locally doping with laser to form regions having different doping concentrations. The region having a high doping concentration has less contact resistance, while the region having a low doping concentration has greater carrier recombination rate. During laser doping, a target area is usually heavily doped by increasing power of the laser. However, increasing the laser power also increases the damage to the textured surface of the silicon substrate, thereby affecting a subsequent passivation effect and limiting an ability of laser doping technology to further reduce the contact resistance between the metal grid line and the silicon substrate.

A method for making TOPCon solar cell is provided, which utilize laser-enhanced contact optimization (LECO) technology to assist in sintering conductive metal paste to solidify and form metal grid lines. The LECO technology can form an ohmic contact between the metal having a low resistance and silicon without damaging the passivation layer on the silicon substrate, thereby reducing the contact resistance between the metal grid lines and silicon without additional doping steps. Therefore, there is no need to make the laser selective emitter, and the LSE step can be omitted. The method for making the TOPCon solar cell in the present disclosure can further release a doping concentration window in light absorption area without affecting the contact between the metal grid lines and the silicon substrate, thereby improving the conversion efficiency of the cell. In additional, the present disclosure uses laser to scan the metal grid lines on the front surface while maintaining a deflection voltage applied on the solar cell. The laser has a power density of 500-50000 W/cm$^2$ and a scanning speed of 20000-60000 mm/s, which can ensure a process effect after laser scanning and avoid overburning. The present disclosure combines boron diffusion and high-temperature oxidation treatment in a same machine, which can effectively save process time.

FIG. 1 is a flowchart of a method for making a TOPCon solar cell according to an embodiment of the present disclosure. It should be noted that the method is not limited to an order of the following steps, and in other embodiments, the method may only include one part of the following steps, or some of the steps may be deleted.

The following provides a detailed introduction to the method for making the TOPCon solar cell combined with explanation of each step in FIG. 1. The method includes the following steps S1 to S10.

Step S1: providing a silicon substrate and performing a texturing process to form textured structure on a surface of the silicon substrate. The silicon substrate is an N-type silicon substrate. The silicon substrate includes a first surface, a second surface opposite to the first surface, and at least one side surface connecting the first surface and the second surface.

In the present embodiment, the first surface is the front surface of the silicon substrate, and the second surface is the back surface of the silicon substrate.

The N-type silicon substrate is doped with N-type doping elements. The N-type doping elements can be at least one selected from phosphorus (P), bismuth (Bi), antimony (Sb), and arsenic (As).

The purpose of texturing the surface of the silicon substrate is to remove a mechanical damage layer, oil stains, impurity particles, and metal impurities on the surface, form an uneven textured structure, increase surface area of the silicon substrate and form a sunken structure. The sunken structure can increase absorption of sunlight and reduce reflection of sunlight.

In some embodiments, a reflectivity of the surface of the silicon substrate after texturing process is less than 11%. Texturing process can be applied only to the first surface or to both the first surface and the second surface of the silicon substrate.

Step S2: performing boron doping to the silicon substrate.

The purpose of the step S2 is to form a P-N junction. Due to the fact that the silicon substrate is an N-type silicon substrate, meaning that a N-type semiconductor have been pre-formed in the silicon substrate, boron diffusing of the step S2 is carried out to form a P-type semiconductor in the silicon substrate. The P-type semiconductor and the N-type semiconductor in the silicon substrate cooperatively form the P-N junction. The P-N junction forms a space charge region and constructs an internal electric field.

The boron doping to the silicon substrate generally includes boron diffusion and high-temperature oxidation to the silicon substrate. The step S2 may uses a boron diffusion machine or a combination of a boron diffusion machine and an oxidation machine to diffuse impurity element boron to the first surface of the silicon substrate. The boron source can be selected from one or more selected from at least one precursor such as $BCl_3$, $BBr_3$, $B_2H_6$, trimethylboron, etc. After the step S2, a square resistance of the first surface of the silicon substrate reaches to a range of 200 ohm/sq to 800 ohm/sq. During the boron diffusion, a boron doped diffusion layer is formed at a certain depth inward on the surface of the silicon substrate (including the first surface, the second surface, and the side surface), and a borosilicate glass (BSG) is formed on an outermost surface of the silicon substrate due to a high concentration of boron. The BSG layer on the first surface has a thickness of 70 nm to 110 nm. A concentration of boron is controlled in a range between 0 to $1*10^{20}$ $cm^{-3}$. In some embodiments, a surface concentration of boron is controlled to be $2*10^{18}$ $cm^{-3}$ to $6*10^{18}$ $cm^{-3}$.

Boron diffusion is carried out in a first temperature range, and high-temperature oxidation treatment is carried out in a second temperature range. A minimum value of the second temperature range is greater than a maximum value of the first temperature range. For example, the first temperature range is 700° C. to 900° C., and the second temperature range is 950° C. to 1050° C.

In some embodiments, boron diffusion and high-temperature oxidation require the silicon substrate to be sequentially placed in the boron diffusion machine and the high-temperature oxidation machine. That is, the silicon substrate is sequentially placed in two separate machines. A temperature for boron diffusion is in a range from 700° C. to 900° C., and a process time for boron diffusion is in a range from 80 minutes to 100 minutes. A temperature for the high-temperature oxidation is in a range from 950° C. to 1050° C., which is higher than the temperature for boron diffusion, and the process time for the high-temperature oxidation is in a range from 150 minutes to 170 minutes.

In other embodiments, a single boron diffusion machine equipped with a high-temperature thermal field is used. The boron diffusion machine has both medium temperature (700° C. to 900° C. source diffusion and high temperature (950° C. to 1050° C.) oxidation promotion functions. That is, boron diffusion and high-temperature oxidation are completed in the single boron diffusion machine. The process time of this method is generally 180 minutes to 210 minutes, which effectively saves process time compared to the two separate machines using boron diffusion and high-temperature oxidation.

Step S3: removing the boron doped diffusion layer and the borosilicate glass (BSG) layer on the second surface and the side surface of the silicon substrate.

The boron diffusion process will form the boron doped diffusion layer and the BSG layer on each surface of the silicon substrate. The boron doped diffusion layer and the BSG layer formed on the side surface of the silicon substrate are prone to short circuits, the boron doped diffusion layer and the BSG layer formed on the second surface of the silicon substrate will affect subsequent passivation, so both need to be removed. The purpose of the step S3 is to remove the boron doped diffusion layer and the BSG layer on the second surface and the side surfaces of the silicon substrate in step S2.

In some embodiments, the silicon substrate is first etched by using a chain type BSG removing machine containing a hydrofluoric acid solution, with the first surface facing upwards to remove the BSG on the second surface and the side surfaces. Then, the silicon substrate is etched by using a trough type machine containing an alkaline solution to remove the boron doped diffusion layer on the second surface and the side surfaces.

In some specific examples, a chain type BSG machine and an alkali polishing machine are used to polish the second surface of the silicon substrate, in order to remove the boron doped diffusion layer and the BSG layer on the side surfaces and second surface of the silicon substrate, and thus prepare for doping a polycrystalline silicon layer on the second surface. A roller speed of the chain type BSG removing machine is controlled to be 3.2 m/min to 4.6 m/min. The roller transports the silicon substrate and soaks a single side (the second surface) of the silicon substrate in a hydrofluoric acid solution having a conductivity of 400-600 mS/cm. The second surface of the silicon substrate is soaked in the hydrofluoric acid solution for 1 minute to 2 minutes to remove the BSG layer formed on the second surface and the side surfaces. Then, the silicon substrate is transferred to a trough type alkaline polishing machine, and placed in the alkaline polishing solution of the alkaline polishing machine to remove the boron doped diffusion layer on the second surface and the side surfaces. The alkaline polishing solution contains one selected from KOH, NaOH, and TMAH and corresponding additives, and an etching depth of the silicon substrate is controlled to be 2 μm to 5 μm.

Step S4: forming a tunnel oxide layer and a doped polycrystalline silicon layer on the second surface side of the silicon substrate.

The step S4 may include: sequentially forming a tunnel oxide layer and an intrinsic amorphous silicon layer on the second surface by low pressure chemical vapor deposition (LPCVD); performing phosphorus diffusion to the second surface side to convert the intrinsic amorphous silicon layer into a doped polycrystalline silicon layer.

In some embodiments, the tunnel oxide layer is made of silicon oxide and has a thickness in a range from 1.5 nm to 2.5 nm.

Since the silicon substrate is an N-type silicon substrate, the doping elements inside the doped polycrystalline silicon layer can be a N-type doping elements, such as phosphorus. In some embodiments, the doped polycrystalline silicon layer has a thickness of 60 nm to 200 nm.

In some embodiments, after forming the doped polycrystalline silicon layer, the phosphorus doping concentration on the second surface is controlled to be greater than $2*10^{20}$ $cm^{-3}$. The method for forming the doped polycrystalline silicon layers includes: forming the doped amorphous silicon using LPCVD technology followed by annealing process, forming intrinsic amorphous silicon using LPCVD technology followed by phosphorus diffusion process, forming doped amorphous silicon using plasma enhanced chemical vapor deposition (PECVD) technology followed by annealing process, and forming doped amorphous silicon using physical vapor deposition (PVD) technology followed by annealing process.

In a specific example, the tunnel oxide layer and the intrinsic amorphous silicon layer are sequentially formed on the second surface side by LPCVD. Then, phosphorus diffusion is performed on the second surface side to convert the intrinsic amorphous silicon layer into a doped polycrystalline silicon layer. Furthermore, when LPCVD is performed on the second surface side, intrinsic amorphous silicon layers are also form on the first surface and the side surfaces. When phosphorus diffusion is performed on the second surface side, at least part of the intrinsic amorphous silicon layers will convert into phosphorus doped polycrystalline silicon layers on the first surface and the side surfaces. Moreover, outermost of the polycrystalline silicon layers on the first surface and the side surfaces, as well as outermost of the doped polycrystalline silicon layer on the second surface, have a high phosphorus content, will form a phosphosilicate Glass (PSG) layer.

Step S5: removing the PSG layer and the polycrystalline silicon layers on the first surface and the side surfaces formed in the step S4, and the PSG formed on the second surface formed in the step S4, and the BSG on the first surface formed in the step S2.

The main purpose of the step S5 is to remove the byproducts formed on the silicon substrate in the step S4, including the PSG and polycrystalline silicon layer on the first surface and the side surfaces, as well as the PSG on the second surface, and to remove the BSG on the first surface in the step S2.

In some embodiments, the step S5 includes: etching the silicon substrate through a chain type PSG removing machine containing a hydrofluoric acid solution and making the second surface face upwards to remove PSG on the first surface and side surfaces; etching the silicon substrate by a trough type machine containing alkaline solution to remove the polycrystalline silicon layer formed on the first surface and the side surfaces; and etching the silicon substrate by a trough type machine containing hydrofluoric acid solution to remove the BSG on the first surface and the PSG on the second surface. The polycrystalline silicon layer includes the doped polycrystalline silicon layer.

In some specific examples, a roller speed of the chain type PSG removing machine is controlled to be 3.2 m/min to 4.6 m/min. The roller transports and soaks the silicon substrate into a hydrofluoric acid solution having a conductivity of 60 mS/cm to 180 mS/cm, allowing the first surface of the silicon substrate to soak in the hydrofluoric acid solution for 1-2 minutes to remove the PSG on the first surface and the side surfaces. Then, the silicon substrate is transferred to a trough type polishing machine containing alkaline polishing solution, wherein the alkaline polishing solution contains one selected from KOH, NaOH, and TMAH and corresponding additives. The polycrystalline silicon layer or intrinsic amorphous silicon layer on the first surface and the side surfaces is controlled to be completely removed. Finally, the silicon substrate is transferred into a trough type polishing machine containing a hydrofluoric acid solution to remove the BSG on the first surface and the PSG on the second surface.

Step S6: depositing a passivation layer on the first surface or on each of the first surface and the second surfaces of the silicon substrate.

The step S6 can use atomic layer deposition (ALD) technology or plasma enhanced atomic layer deposition (PEALD) technology to deposit a passivation layer on the first surface of the silicon substrate, or to deposit a passivation layer on both the first surface and the second surface of the silicon substrate.

In some embodiments, the passivation layer has a thickness of 2 nm to 8 nm, and the passivation layer can be made of aluminum oxide.

Step S7: depositing anti-reflection layers on each of the first surface and the second surface of the silicon substrate.

In some embodiments, the anti-reflection layer is made of SiyNx or $Si_zN_xO_y$, and the anti-reflection layer has a function of reducing reflection and increasing transmission. A thickness of the anti-reflection layer is controlled to be 70 nm to 90 nm.

The anti-reflection layer on the first surface is formed on the passivation layer. If there is a passivation layer on the second surface, the anti-reflection layer on the second surface is formed on the passivation layer. If there is no passivation layer on the second surface, the anti-reflection layer on the second surface is formed on the doped polycrystalline silicon layer.

Step S8: forming metal grid lines on each of the first surface and the second surface of the silicon substrate to form a solar sheet.

In some embodiments, the step S8 includes printing conductive metal paste on both the first surface and the second surfaces, solidifying the conductive metal paste by sintering to form metal grid lines, and making the metal atoms in the conductive metal paste to contact with the silicon substrate.

It can be understood that sintering can solidify the conductive metal paste to form metal grid lines combining with the silicon substrate. The conductive metal paste is printed on the anti-reflection layer, and during the sintering process, the metal atoms in the conductive metal paste will pass through the passivation layer and anti-reflection layer and contact with the silicon substrate.

Conductive metal paste can be silver paste, or copper paste, etc., but not limited to this. In some embodiments, multiple conductive metals can be mixed in the conductive metal paste.

The printing method for conductive metal paste can be screen printing or laser graphic transfer, but are not limited to this.

Sintering may be carried out in a sintering furnace. The sintering temperature required for the first surface metal grid lines is usually higher than that required for the second surface metal grid lines. In this step, the sintering temperature of the sintering furnace is set to be the sintering temperature required for the second surface metal grid lines, so that the metal grid lines on the second surface is completed sintering, while the metal grid lines on the first surface is not fully sintered. Therefore, it is necessary to rely on LECO technology in the subsequent steps for assisted sintering. In some embodiments, the sintering temperature set in the step S8 is in a range from 760° C. to 880° C., such as 760° C., 770° C., 780° C., 790° C., 800° C., 810° C., 820° C., 830° C., 840° C., 850° C., 860° C., 870° C., 880° C., etc.

Step S9: applying a deflection voltage to the solar sheet, wherein the deflection voltage has an electric field in a first direction, the first direction is a direction from the second surface to the first surface. The deflection voltage has a range from 5 V to 30 V.

The step S9 includes placing the solar sheet on a conductive metal plate, so that the second surface of the solar sheet contacts with the conductive metal plate; placing a conductive probe on the solar sheet to make the conductive probe to be in direct contact with the metal grid line on the first surface. The conductive metal plate and the conductive probe are electrically connected to a positive electrode and a negative electrode of a voltage source, respectively. That is, the conductive metal plate is electrically connected to the positive electrode and the conductive probe is electrically to the negative electrode, thus the deflection voltage can be applied to the solar sheet. The electric field of the deflection voltage has a direction that is opposite to the direction of the internal electric field formed by the P-N junction of the solar sheet.

If the deflection voltage is too high, reverse breakdown may occur. If the deflection voltage is too low, the effect of subsequent laser scanning may not be significant. In some embodiments, in the step S9, the deflection voltage is in a range from 10 V to 20 V.

Step S10: maintaining the deflection voltage and using laser to scan the metal grid lines on the first surface. The laser has a power density in a range from 500 W/cm$^2$ to 50000 W/cm$^2$, and a scanning speed in a range from 20000 mm/s to 60000 mm/s.

The step S10 involves treating the silicon substrate using LECO technology, scanning the metal grid line area on the first surface of the silicon substrate by a laser while maintaining the deflection voltage applied on the solar cell.

The laser having a high power density can easily cause local temperature to be too high and lead to overburning. If the power density is too low, the sintering degree is not enough, making the effect after laser scanning not obvious. The laser has a power density controlled to be in a range from 500 W/cm$^2$ to 50000 W/cm$^2$ can ensure the laser scanning effect and avoid overburning.

In some embodiments, the laser is infrared pulse laser or infrared continuous laser having a wavelength of 350 nm to 1500 nm and a power of 10 W to 100 W. The laser spot is a strip shaped spot having a length of 0.5 mm to 5 mm and a width of 80 μm to 1000 μm. In some embodiments, the length of the strip-shaped spot is 0.5 mm to 2 mm.

The laser having a low wavelength can easily cause a high generated current and local overheating. If the laser has a high wavelength, absorption of the laser will not be high, making it difficult to generate current and resulting in a poor sintering effect. In some embodiments, the laser has a wavelength in a range from 900 nm to 1200 nm.

In the case of a certain laser scanning region, excessive laser power can easily cause local temperature deviation and overburning, while insufficient power can result in insufficient sintering effect. In some embodiments, the laser has a power in a range from 40 W to 50 W.

In the step S10, a time period for each position on the metal grid lines to be scanned by the laser is in a range from 10 μs to 40 μs. Due to a certain area size of the silicon substrate, completing laser scanning of the silicon substrate needs a certain time. In some embodiments, a total time for laser scanning one single silicon substrate is in a range of 0.3 s to 3 s.

A projection area of the metal grid lines on the first surface side of the solar sheet on the silicon substrate is an improvement area. A contact resistance of the improvement area before the step S10 is a first resistance, and a contact resistance of the improvement area after the step S10 is a second resistance. The second resistance is less than the first resistance.

The solar cells obtained in the step S10 can also be tested and sorted, including testing the solar cells produced in the step S10 and grading the solar cells having different conversion efficiencies.

The LECO technology excites charge carriers by irradiating solar sheet with high-intensity laser. At the same time, a deflection voltage of 10V or more is applied to the solar sheet to generate a local current of several amperes, then the laser irradiated area of the solar sheet is sintered, and mutual diffusion between the metal conductive paste and silicon is achieved. In this way, the contact resistance between the metal grid lines and the silicon substrate can be significantly reduced. The LECO technology allows for a larger sintering temperature window, correct contact on ultra-low doped emitters, and allows for higher open circuit voltage Voc. The conductive carriers on the first surface of the TOPCon cell is mainly holes. When the LECO increases the reverse voltage, a large number of free electrons is excited. When encountering colloidal conductive metals with high resistance, it generates instantaneous high temperature, causing the conductive metal paste and silicon to form co-diffusion. When the diffusion contact forms and the electrical resistance reduces, heat at the melting point disappears instantly, and the temperature decreases. A contact quality of the conductive metal paste-silicon alloy area formed is higher than that of the conductive metal crystallization, which solves the first surface contact problem of the TOPCon cells.

The advantages of LECO technology include improved cell efficiency, precise control, reduced cell loss, increased production capacity and reliability, and reduced manufacturing costs. Specifically, the advantages includes: (1) LECO can improve the conversion efficiency of the solar cell by optimizing metal contacts and reducing contact resistance, thereby obtaining higher current at the same line width or narrower lines at the same current; (2) laser technology can precisely control the heat affected area, allowing for destruction of the passivation layer and the formation of metal contact without damaging the active area of the cell; (3) a traditional thermal sintering process may cause damage to the entire silicon substrate, LECO as a non-contact technology, has lower risks and reduces thermal stress and damage to the silicon substrate; (4) the LECO process has a high degree of automation and can be integrated into high-speed production lines, which helps to improve consistency and reliability of cell production; (5) due to the high precision of laser processing, the amount of metal used and manufacturing costs can be reduced. In addition, the LECO offers a wide range of integration levels and cell types.

Figure 2:
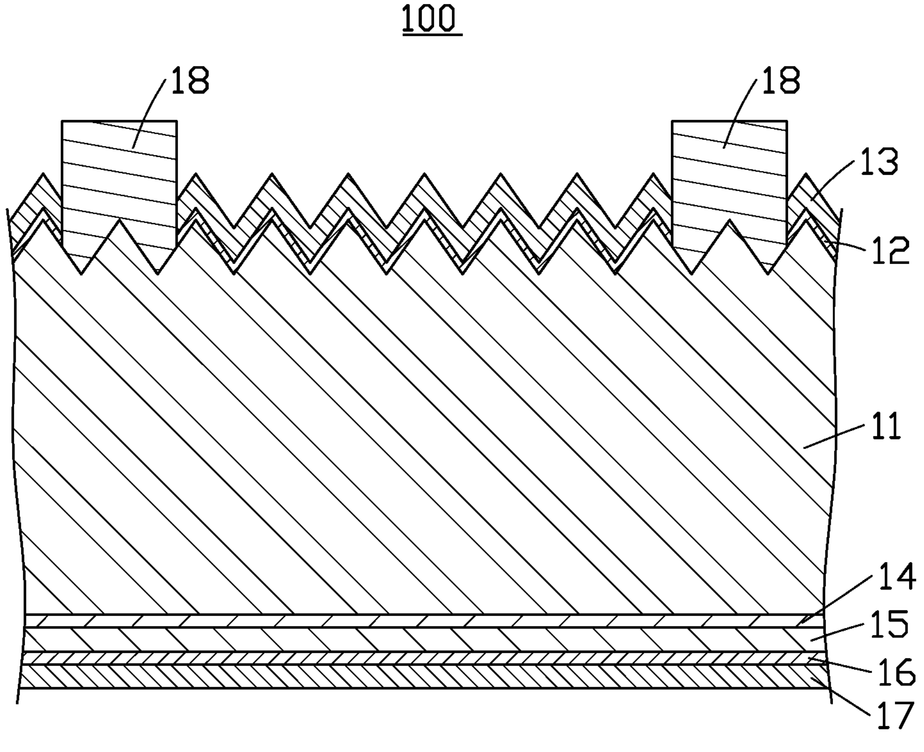
FIG. 2 is a cross-sectional view of a TOPCon solar cell according to an embodiment of the present disclosure.

FIG. 2 illustrates a TOPCon solar cell 100. The TOPCon solar cell 100 includes a silicon substrate 11, a first passivation layer 12 and a first anti-reflection layer 13 sequentially located on a first surface of the silicon substrate 11, and a metal grid lines 18 on the first surface of the silicon substrate 11. The metal grid lines 18 are formed on a side of the first anti-reflection layer 13 away from the silicon substrate 11. The TOPCon solar cell 100 also includes a tunnel oxide layer 14, a doped polycrystalline silicon layer 15, a second passivation layer 16, and a second anti-reflection layer 17 sequentially on a second surface of the silicon substrate 11. The first surface is opposite to the second surface. In some embodiments, the second passivation layer 16 can also be omitted.

Each of the first passivation layer 12 and the second passivation layer 16 can be made of aluminum oxide, and has a thickness in a range from 2 nm to 8 nm. Each of the first anti-reflection layer 13 and the second anti-reflection layer 17 is made of $Si_yN_x$ or $Si_zN_xO_y$, and has a thickness in a range from 70 nm to 90 nm. The tunnel oxide layer 14 has a thickness in a range from 1.5 nm to 2.5 nm, and the doped polycrystalline silicon layer 15 has a thickness in a range from 60 nm to 200 nm.

Following is a further explanation of the method of the present disclosure by specific examples.

Example 1

The solar cell of the example 1 is made according to the following steps.

texturing: a wet machine is used to make a textured surface having a high specific surface area on the first surface of an N-type monocrystalline silicon substrate.

Boron diffusing plus high-temperature oxidizing: a boron diffusion machine is equipped with a high-temperature thermal field, and the boron source is $BCl_3$. A square resistance of the first surface of the silicon substrate is controlled to be 250 ohm/sq. The thickness of BSG is controlled to be 90 nm. The surface concentration of boron is controlled to be $4*10^{18}$ $cm^{-3}$. The temperature of boron diffusion is controlled to be 800° C., then the temperature is raised to be 1000° C. and keep at 1000° C. for oxidation.

A chain type BSG removing machine and an alkali polishing machine are used to polish the second surface and the side surfaces of the silicon substrate. The chain type BSG removing machine has rollers to transports the silicon substrates. A roller speed of the chain type BSG removing machine is controlled to be 4 m/min, and the roller transports the silicon substrate and soaks a single side (the second surface) of the silicon substrate in a hydrofluoric acid solution having a conductivity of 500 mS/cm for 1.5 minute to remove the BSG layer formed on the second surface and the side surfaces. Then, the silicon substrate is transferred to a trough type alkaline polishing machine to remove the boron doped diffusion layer on the second surface and the side surfaces. The alkaline polishing solution contains KOH and additives, and an etching depth of the silicon substrate is controlled to be 3 μm.

A tunnel oxide layer having a thickness of 2 nm and a phosphorus doped polycrystalline silicon layer having a thickness of 120 nm are formed on the second surface of the silicon substrate.

A chain type PSG removing machine, an alkaline polishing machine, and an acid polishing machine are used to treat the first surface, the second surface and the side surfaces of the silicon substrate. A roller speed of the chain type PSG removing machine is controlled to be 4 m/min. The roller transports and soaks the silicon substrate into a hydrofluoric acid solution having a conductivity of 120 mS/cm, allowing the first surface of the silicon substrate to soak in the hydrofluoric acid solution for 1.5 minutes to remove the PSG on the first surface and the side surfaces. Then, the silicon substrate is transferred to a trough type polishing machine containing alkaline polishing solution to remove the polycrystalline silicon layer on the first surface and the side surfaces, wherein the alkaline polishing solution contains KOH and corresponding additives. Finally, the silicon substrate is transferred into a trough type polishing machine containing a hydrofluoric acid solution to remove the BSG on the first surface and the PSG on the second surface.

Depositing a passivation layer: a passivation layer made of $Al_2O_3$ and having a thickness of 5 nm is formed on the first surface and the second surface of the silicon substrate using ALD technology.

Depositing anti-reflection layer: an anti-reflection layer made of $Si_yN_x$ and having a thickness of 80 nm is deposited on the first and second surfaces of the silicon substrate.

Forming metal grid lines: printing conductive silver paste on the first and second surfaces of the silicon substrate, and sintering and solidifying at 820° C. to form metal grid lines to obtain the solar cell.

LECO: applying a deflection voltage of 14V to the solar cell and using laser to scan the metal grid lines on the first surface, using an infrared pulse laser having a wavelength of 500 nm, a laser power of 45 W, a power density of 5000 W/$cm^2$, and a scanning speed of 40000 mm/s, the laser spot is a strip shaped spot having a length of 1 mm and a width of 100 μm.

Example 2 to Example 8

The process parameters of each step in the Example 2 to Example 8 are basically the same as those of each step in the example 1, and the specific differences between the second embodiment to the eighth embodiment and the example 1 are shown in table 2.

Comparative Example 1

The solar cell of the comparative example 1 was made using a conventional TOPCon process. The difference between the comparative example 1 and the example 1 is that the LSE step was added between the boron diffusion step and the high-temperature oxidation step, while the LECO step was omitted. The specific steps for preparation in the comparative example 1 includes: texturing, boron diffusing, LSE, high-temperature oxidizing, removing BSG on the second and side surfaces+removing the boron doped diffusion layer by alkaline polishing, doping the polycrystalline silicon on the second surface, removing PSG and polycrystalline silicon layer on the first and side surfaces+removing PSG on the second surface+removing BSG on the first surface, depositing passivation layer, deposition anti-reflection layer, printing metal grid lines+sintering. The process parameters for each step in the Comparative example 1 are basically the same as those for each step of example 1.

Comparative Example 2

The comparative example 2 is basically the same as the comparative example 1, but the difference between the comparative example 2 and the comparative example 1 is that in the sintering process of the metal grid, the sintering temperature in the comparative example 2 is 840° C.

Table 1 shows a comparison of parameters between two types of cells made by the conventional TOPCon process, the process parameters for both types of cells are the same except for the first surface resistance. Table 1 shows changes in conversion efficiency (Eta), short-circuit current (Isc), open circuit voltage (Voc), fill factor (FF), and parallel resistance (Rsh) of a cell having a first surface square resistance of 350 ohm/sq compared to a cell having a first surface square resistance of 250 ohm/sq, with "+" representing an increase and "−" representing a decrease. It can be seen from table 1 that in the conventional TOPCon process, if the first surface resistance of the cell is increased from 250 ohm/sq to 350 ohm/sq, although the conversion efficiency of the cell will slightly increase by 0.03%, the filling factor will decrease by 0.13%, indicating that increasing the first surface square resistance of the cell is not conducive to improving the filling factor of the cell. It should be noted that filling factor is an important parameter for performance of solar cell, and the greater its value, the better the performance of solar cell.

TABLE 1

| conventional TOPCon process | Eta (%) | Isc (A) | Voc (mV) | FF (%) | Parallel Resistance Rsh. (Ω) |
|---|---|---|---|---|---|
| Square Resistance of first surface 250 ohm/sq | — | — | — | — | — |
| Square Resistance of first surface 350 ohm/sq | +0.03% | +0.008 | +1.44 | −0.13% | −619 |

The conversion efficiency (Eta), open circuit voltage (Voc), short circuit current (Isc), and fill factor (FF) of the cells in the examples 1 to 8 and comparative examples 1 and 2 are shown in Table 2.

TABLE 2

| — | First surface resistance (ohm/sq) | Sinter temperature (° C.) | Scanning speed (mm/s) | deflection voltage (V) | Eta (%) | Voc (V) | Isc (A) | FF (%) |
|---|---|---|---|---|---|---|---|---|
| Example1 | 250 | 780° C. | 40000 | 14 | 25.427 | 0.7306 | 14.0652 | 85.461 |
| Example2 | 250 | 800° C. | 40000 | 14 | 25.4476 | 0.7304 | 14.0714 | 85.516 |
| Example3 | 250 | 820° C. | 40000 | 14 | 25.4926 | 0.7305 | 14.0733 | 85.644 |
| Example4 | 350 | 820° C. | 40000 | 14 | 25.5186 | 0.73194 | 14.0813 | 85.514 |
| Example5 | 450 | 820° C. | 40000 | 14 | 25.5053 | 0.73207 | 14.0784 | 85.472 |
| Example6 | 550 | 820° C. | 40000 | 14 | 25.4982 | 0.73271 | 14.0762 | 85.387 |
| Example7 | 250 | 820° C. | 40000 | 16 | 25.4240 | 0.7295 | 14.0731 | 85.532 |
| Example8 | 250 | 840° C. | 40000 | 14 | 25.3782 | 0.729 | 14.0631 | 85.497 |
| comparative example 1 | 250 | 820° C. | — | — | 25.2304 | 0.7271 | 14.0506 | 85.297 |
| comparative example 2 | 250 | 840° C. | — | — | 25.2174 | 0.7273 | 14.052 | 85.221 |

It can be seen from Table 2 that compared to the cell in the comparative examples 1 and 2, the Eta, the Voc, the Isc, the FF of the cells in the Examples 1 to 8 have been improved, indicating that the cell made by the method of the present disclosure has better performance.

It can be seen from Table 2 that compared to the cell in the comparative examples 1 and 2, the Eta, the Voc, the Isc, the FF of the cells in the Examples 1 to 8 have been improved, indicating that the cell made by the method of the present disclosure has better performance.

In addition, compared to the comparative examples 1 and 2, in the case of a same first surface resistance of 250 ohm/sq, the cells of Examples 1 to 3 have significantly improved Eta, Voc, Isc, FF, indicating that the cell made by the making method of the present disclosure has better performance.

In addition, compared to the comparative examples 1 and 2, even if the first surface square resistance of the cell in Examples 4 to 6 is increased to 350 ohm/sq, 450 ohm/sq, and 550 ohm/sq, the Eta, the Voc, the Isc, the FF are significantly improved.

The method for making the TOPCon cell in the present disclosure further enhances a concentration window of p-type element doping on the first surface of the cell through LECO technology and its process parameter settings, without affecting contact between the metal grid lines and the silicon substrate, thereby improving the cell conversion efficiency. Compared to the traditional method for making the TOPCon cell containing laser SE technology, the present disclosure can widen the first surface square resistance to be in a range of 100 ohm/sq to 300 ohm/sq. The method for making the TOPCon cell in the present disclosure can relax the first surface resistance to 200-800 ohm/sq. The recombination of the first surface absorption area of the cell is further reduced, and the voltage and conversion efficiency of the cell circuit are both improved. In addition, by introducing LECO technology, the LSE process will no longer be required. Furthermore, boron diffusion and high-temperature oxidation can be combined into a high-temperature boron diffusion process, further shortening the process time.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for making a solar cell, comprising:

Step S1: providing a silicon substrate and texturing the silicon substrate, the silicon substrate being an N-type silicon substrate and comprising a first surface, a second surface opposite to the first surface, and at least one side surface connecting each of the first surface and the second surface, and texturing being performed on the first surface of the silicon substrate;

Step S2: performing boron doping to the silicon substrate;

Step S3: removing a boron doped diffusion layer and borosilicate glass on the second surface and on the at least one side surface;

Step S4: forming a tunnel oxide layer and a doped polycrystalline silicon layer on the second surface;

Step S5: removing phosphorus silicon glass and a polycrystalline silicon layer on the first surface and the at least one side surface, phosphorus silicon glass on the second surface, and borosilicate glass on the first surface;

Step S7: depositing an anti-reflection layer on each of the first surface and the second surface;

Step S8: forming metal grid lines on each of the first surface and the second surface thereby forming a solar sheet;

Step S9: applying a deflection voltage to the solar sheet, wherein the deflection voltage has an electric field in a first direction, the first direction is a direction from the second surface to the first surface, and the deflection voltage is in a range from 5 V to 30 V; and Step S10: maintaining the deflection voltage and using laser to scan the metal grid lines on the first surface, wherein the laser has a power density in a range from 500 W/cm$^2$ to 50000 W/cm$^2$ and a scanning speed in a range from 20000 mm/s to 60000 mm/s.

2. The method of claim 1, wherein the step S2 further comprises controlling the boron doping such that the first surface of the silicon substrate has a square resistance in a range from 200 ohm/sq to 800 ohm/sq.

3. The method of claim 1, wherein the boron doping to the silicon substrate to the silicon substrate comprises boron diffusion and high-temperature oxidation to the silicon substrate; the boron diffusion is carried out in a first temperature range, the high-temperature oxidation is carried out in a second temperature range; a minimum value of the second temperature range is greater than a maximum value of the first temperature range.

4. The method of claim 3, wherein the first temperature range is 700° C. to 900° C., and the second temperature range is 950° C. to 1050° C.

5. The method of claim 1, wherein the step S2 is carried out in a boron diffusion machine equipped with a high-temperature thermal field, the boron doping is performed in the boron diffusion machine.

6. The method of claim 1, wherein the step S9 comprises:

placing the solar sheet on a conductive metal plate to make the second surface of the solar sheet in contact with the conductive metal plate; and placing a conductive probe on the solar sheet to make the conductive probe to be in direct contact with the metal grid lines on the first surface, wherein the conductive metal plate is electrically connected to a positive electrode of a voltage source, and the conductive probe is electrically connected to a negative electrode of the voltage source.

7. The method of claim 1, wherein in the step S9 and the step S10, the deflection voltage is in a range from 10 V to 20 V.

8. The method of claim 1, wherein in the step S10, the laser has a wavelength of 350 nm to 1500 nm and a power of 10 W to 100 W, the laser is infrared pulse laser or infrared continuous laser.

9. The method of claim 8, wherein in the step S10, the laser has a strip shaped spot having a length of 0.5 mm to 5 mm and a width of 80 μm to 1000 μm; in the step S10, a time period for each position on the metal grid lines to be scanned by the laser is in a range from 10 us to 40 us.

10. The method of claim 8, wherein the laser has a wavelength in a range from 900 nm to 1200 nm.

11. The method of claim 1, wherein a projection area of the metal grid lines on the first surface on the silicon substrate is an improvement area, a contact resistance of the improvement area before the step S10 is a first resistance, a contact resistance of the improvement area after the step S10 is a second resistance, the second resistance is less than the first resistance.

12. The method of claim 1, wherein the step S8 comprises printing conductive metal paste on each of the first surface and the second surfaces, sintering the conductive metal paste to solidify the conductive metal paste to form the metal grid lines.

13. The method of claim 1, wherein a sintering temperature in the step S8 is in a range from 760° C. to 880° C.

14. The method of claim 1, wherein the step S3 comprises:

etching the silicon substrate by a chain type machine containing a hydrofluoric acid solution, with the first surface of the silicon substrate facing upwards, to remove the borosilicate glass on the second surface and on the at least one side surface; and etching the silicon substrate by a trough type machine containing an alkaline solution to remove the boron doped diffusion layer on the second surface and on the at least one side surface.

15. The method of claim 1, wherein the step S4 comprises:

sequentially forming the tunnel oxide layer and an intrinsic amorphous silicon layer on the second surface by low pressure chemical vapor deposition; and performing phosphorus diffusion to convert the intrinsic amorphous silicon layer into the doped polycrystalline silicon layer.

16. The method of claim 1, wherein the step S5 comprises:

etching the silicon substrate by a chain type machine containing a hydrofluoric acid solution, with the second surface of the silicon substrate facing upwards, to remove the phosphorus silicon glass on the first surface and on the at least one side surface;

etching the silicon substrate by a trough type machine containing alkaline solution to remove the polycrystalline silicon layer on the first surface and on the at least one side surface, the polycrystalline silicon layer comprises the doped polycrystalline silicon layer; and etching the silicon substrate by a trough type machine containing hydrofluoric acid solution to remove borosilicate glass on the first surface and phosphorus silicon glass on the second surface.

17. The method of claim 1, wherein the step S4 further comprises forming the tunnel oxide layer having a thickness in a range from 1.5 nm to 2.5 nm; and forming the doped polycrystalline silicon layer having a thickness in a range from 60 nm to 200 nm.

18. The method of claim 1, further comprising a Step S6: depositing a passivation layer on the first surface or on each of the first surface and the second surface; wherein the Step S6 further comprises depositing an aluminum oxide layer having a thickness of 2 nm to 8 nm as the passivation layer.

19. The method of claim 1, wherein the Step S7 further comprises depositing an $Si_yN_x$ or $Si_2N_xO_y$ layer having a thickness of 70 nm to 90 nm as the anti-reflection layer.

* * * * *